United States Patent
Manning

[19]
[11] Patent Number: 5,930,662
[45] Date of Patent: *Jul. 27, 1999

[54] METHOD OF MAKING OHMIC CONTACT BETWEEN A THIN FILM POLYSILICON LAYER AND A SUBSEQUENTLY PROVIDED CONDUCTIVE LAYER AND INTEGRATED CIRCUITRY

[75] Inventor: Monte Manning, Kuna, Id.

[73] Assignee: Micron Technology, Inc., Boise, Id.

[*] Notice: This patent is subject to a terminal disclaimer.

[21] Appl. No.: 08/665,508

[22] Filed: Jun. 18, 1996

Related U.S. Application Data

[63] Continuation of application No. 08/321,560, Oct. 12, 1994, abandoned.

[51] Int. Cl.$^6$ .............................. H01L 21/283
[52] U.S. Cl. ............ 438/597; 438/621; 438/647; 438/657
[58] Field of Search .................. 438/597, 621, 438/634, 647, 657, 453

[56] References Cited

U.S. PATENT DOCUMENTS

| | | | |
|---|---|---|---|
| 4,855,248 | 8/1989 | Ariizumi et al. | 437/49 |
| 4,888,306 | 12/1989 | Komatsu et al. | 257/754 |
| 4,966,870 | 10/1990 | Barber et al. | 438/637 |
| 4,978,630 | 12/1990 | Kim | 437/32 |
| 5,084,416 | 1/1992 | Ozaki et al. | 437/190 |
| 5,110,762 | 5/1992 | Nakahara et al. | 257/752 |
| 5,113,234 | 5/1992 | Furuta et al. | 257/384 |
| 5,174,858 | 12/1992 | Yamamoto et al. | 156/643 |
| 5,191,397 | 3/1993 | Yoshida | 257/347 |
| 5,194,929 | 3/1993 | Ohshima et al. | 257/754 |
| 5,204,279 | 4/1993 | Chan et al. | 437/47 |
| 5,236,867 | 8/1993 | Furuta et al. | 437/189 |
| 5,243,219 | 9/1993 | Katayama | 257/740 |
| 5,275,972 | 1/1994 | Ogawa et al. | 438/624 |
| 5,286,663 | 2/1994 | Manning | 437/41 |
| 5,309,023 | 5/1994 | Motonami et al. | 257/773 |
| 5,323,046 | 6/1994 | Ema et al. | 257/382 |
| 5,348,901 | 9/1994 | Chen et al. | 437/47 |
| 5,355,009 | 10/1994 | Honda et al. | 257/370 |
| 5,376,814 | 12/1994 | Lee | 257/385 |
| 5,404,030 | 4/1995 | Kim et al. | 257/930 |
| 5,422,499 | 6/1995 | Manning | 257/69 |
| 5,430,328 | 7/1995 | Hsue | 257/754 |

FOREIGN PATENT DOCUMENTS

| | | | |
|---|---|---|---|
| 5050669 | 4/1980 | Japan | 257/754 |
| 0138950 | 10/1981 | Japan | 257/754 |
| 62-14466 | 1/1987 | Japan | 437/162 |
| 4-209525 | 7/1992 | Japan | 257/758 |

*Primary Examiner*—T. N. Quach
*Attorney, Agent, or Firm*—Trask, Britt & Rossa

[57] ABSTRACT

A method of making ohmic contact between a thin film polysilicon layer of a first conductivity type and a subsequently provided conductive layer includes: a) providing a semiconductor substrate having an outer region; b) providing a first insulating layer outwardly of the outer region; c) etching a first contact opening of a first diameter through the first insulating layer to the substrate outer region; d) providing conductivity enhancing dopant impurity of the first conductivity type into the substrate outer region to render the outer region electrically conductive; e) providing a thin film polysilicon layer of the first conductivity type into the first contact opening and in ohmic electrical connection with the substrate outer region; f) providing a second insulating layer outwardly of the thin film polysilicon layer and the first insulating layer; g) etching a second contact opening of a second diameter into the second insulating layer, the second contact opening overlapping with the first contact opening, the etching providing the second contact opening inwardly to the thin film polysilicon layer; and h) providing an electrically conductive layer atop the second insulating layer and within the second contact opening to the first conductivity type doped substrate outer region. An integrated circuit, including SRAM circuity, is also disclosed.

21 Claims, 9 Drawing Sheets

METHOD OF MAKING OHMIC CONTACT BETWEEN A THIN FILM POLYSILICON LAYER AND A SUBSEQUENTLY PROVIDED CONDUCTIVE LAYER AND INTEGRATED CIRCUITRY

RELATED PATENT DATA

This patent resulted from a continuation application of U.S. patent application Ser. No. 08/321,560, filed on Oct. 12, 1994, entitled "Method Of Making Ohmic Contact Between A Thin Film Polysilicon Layer And A Subsequently Provided Conductive Layer And Integrated Circuitry" listing the inventor as Monte Manning, abandoned.

TECHNICAL FIELD

This invention relates to methods of making ohmic contact between a thin film transistor layer and a subsequently provided conductive layer and to integrated circuitry, such as static random access memory cells employing p-channel thin film load transistors.

BACKGROUND OF THE INVENTION

The invention grew out of needs associated with thin film transistors (TFTs) and their usage and fabrication in high-density static random access memories (SRAMs).

FIG. 1 is a schematic of a typical SRAM cell in accordance with the prior art and aspects of the invention, and is generally designated by reference numeral 10. Static memory cell 10 generally comprises first and second inverters 12 and 14 which are cross-coupled to form a bistable flip-flop. Inverters 12 and 14 are formed by a pair of n-channel driver or pull-down transistors 16 and 17, and p-channel load transistors 18 and 19. Driver transistors 16 and 17 are typically metal oxide silicon field effect transistors (MOSFETs) formed in a single crystal silicon semiconductor substrate. This type of transistor is sometimes referred to as a "bulk" device because its active regions are formed in the bulk substrate. P-channel transistors 18 and 19 are typically thin film transistors formed in a thin layer of polysilicon above the driver transistors.

The source regions of driver transistors 16 and 17 are tied to a low reference or circuit supply voltage, labelled $V_{ss}$ and typically referred to as "ground." Load transistors 18 and 19 preferably share a common thin film source and are connected in series between a high reference or circuit supply voltage, labelled $V_{cc}$, and the drains of the corresponding driver transistors 16 and 17. The gates of load transistors 18 and 19 are connected to the gates of the corresponding driver transistors 16 and 17. The physical construction of many semiconductor memory cells allows a common transistor gate conductor to be used to gate corresponding driver and load transistors, as well known to people of skill in the art.

Inverter 12 has an inverter output 20 formed by the drains of driver transistor 16 and load transistor 18. Similarly, inverter 14 has an inverter output 22 formed by the drains of driver transistor 17 and load transistor 19. Inverter 12 has an inverter input 24 formed by the gate of driver transistor 16 and load transistor 18. Inverter 14 has an inverter input 26 formed by the gate of driver transistor 17 and load transistor 19.

The inputs and outputs of inverters 12 and 14 are cross-coupled to form a flip-flop having a pair of complementary two-state outputs. Specifically, inverter output 20 is cross-coupled to inverter input 26, and inverter output 22 is cross-coupled to inverter input 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 is an n-channel MOSFET having one active terminal connected to cross-coupled inverter output 20. Access transistor 32 is an n-channel MOSFET having one active terminal connected to cross-coupled inverter output 22. A plurality of complementary or "split" column line pairs, such as the single pair of column lines 34 and 36 shown, is connected to the remaining active terminals of access transistors 30 and 32, respectively. A row line 38 is connected to the gates of access transistors 30 and 32.

Reading static memory cell 10 requires activating row line 38 to connect inverter outputs 20 and 22 to column lines 34 and 36. Writing to static memory cell 10 requires first placing selected complementary logic voltages on column lines 34 and 36, and then activating row line 38 to turn on the access transistors 30 and 32 to connect those logic voltages to inverter outputs 20 and 22. This forces the outputs to the selected logic voltages, which will be maintained as long as power is supplied to the memory cell, or until the memory cell is reprogrammed.

Preferably in accordance with the prior art and invention, transistor fabrication occurs by split gate processes. Such are defined as processes where the n-channel polysilicon gate poly and p-channel gate (poly) are patterned using masks and etch steps at different points in the process sequence. This has a number of advantages. First, it allows individual tailoring of the n-channel device and p-channel device gate dimensions. Second, it reduces overall mask count by eliminating separate n-channel and p-channel lightly doped drain, n+ and p+ masks. Third, it allows p-channel formation to occur much later in the process sequence, which provides shallower p+ junctions and therefore higher performance p-channel devices.

A common material for thin film load transistors 18 and 19 is p-doped polysilicon. The thin film layer is typically 500 Angstroms or less in thickness. The n-layer is preferably fabricated such that a common source is formed for illustrated load transistors 18 and 19. The $V_{cc}$ potential is sent into the array onto a portion of the thin film polysilicon layer which is utilized in part as the common source in order to simplify the process. In this manner, an additional layer is not required to bring $V_{cc}$ to the cell.

A major problem in this approach is making ohmic contact to the p+ doped common source $V_{cc}$ formed on the thin film transistor layer. Such is typically accomplished by metallization contacts which are formed to make connection to the p+ common source thin film, to n+ active areas formed elsewhere in the base silicon substrate, and to gate poly layers. Due to the n+ active areas provided in the substrate, a contact etch of sufficient duration must be utilized to reach the silicon surface. However, the thin $V_{cc}$ p+ polysilicon layer typically lies well above the base silicon substrate. Accordingly, the thin polysilicon layer will experience significant over-etch exposure while deeper contacts are being simultaneously formed to the lower n+ active areas.

The subject problem will be better understood by reference to FIG. 2. There illustrated are two fragmented sections of a semiconductor wafer 40, having a common bulk substrate region 42, field oxide regions 43 and other intervening layers indicated generally by reference numeral 44. A thin film transistor layer 45 is provided atop layers 44 and is intended to be representative of a common source area for the FIG. 1 transistors 18 and 19, or a thin film extension therefrom. An n+ diffusion region 46 is provided within base substrate 42. The intent is to provide $V_{cc}$ node interconnection to each of region 46 and thin film layer 45 by an interconnecting line.

An insulating dielectric layer 47 is provided over region 46 and thin film layer 45 as shown. A photoresist etch masking layer 50 is provided. A pair of contact openings 48 and 49 are etched through layer 47 inwardly in the direction of diffusion region 46 and a target area for thin film layer 45, respectively. Once the illustrated etch reaches the outer surface of layer 45, as shown, the polysilicon of layer 45 is subjected to etching conditions. The etching conditions are preferably selected such that the etch rate of layer 47 (typically oxide) is significantly larger than the etch rate of thin film layer 45. However, in spite of the relative high selectivity, the very thin nature of layer 45 typically results in etching occurring completely through thin film layer 45, as shown in FIG. 3.

In a worst case scenario, contact opening 49 would undesirably be etched all the way into bulk substrate 42 (not shown). This would result in an undesired and fatal $V_{cc}$-to-substrate short. In a best case scenario under the circumstances, the etch to produce contact openings 48 and 49 will stop such that contact opening 49 terminates above bulk substrate region 42, as shown. However, this is still undesired as the metallization layer later deposited makes poor surface area contact to thin film layer 45 due to minimum sidewall contact with layer 45 as opposed to outer surface contact. Such can reduce the contact area to layer 45 by a factor of 2.5 or more. Further, titanium, which is usually sputtered into the contact to improve contact conductance and provide a glue layer (not shown) for a subsequent tungsten plug, has poor step coverage. This may result in little or no sidewall titanium in the region of thin film layer 45, thereby increasing the chance that no ohmic contact is formed.

A prior art solution to the problem illustrated by FIGS. 2 and 3 is described with reference to FIG. 4. Such illustrates a wafer fragment 52 comprised of a bulk substrate 53 and associated field oxide regions 54. Like numbers from FIGS. 2 and 3 are utilized with the suffix "a" where appropriate. The intent of this method is essentially to provide a manner by which the thin film transistor layer 45a is brought inwardly in the direction of bulk substrate 53 such that the etch to produce contact openings 48a and 49a is conducted to essentially the same depth. Field oxide 54 is formed to provide a gap or opening inwardly to what would typically be an n-well within bulk substrate 53. Immediately thereafter and prior to removal of the mask, p-type doping is conducted to produce the illustrated p+ diffusion region 55. The n-well of substrate 53 would constitute n-type silicon, thereby providing diode electrical isolation between diffusion region 55 and the n-well.

Next, an oxide layer 56 is provided. A contact opening 57 is provided therethrough to diffusion region 55. P-type thin film poly layer 45a is then deposited and patterned, followed by deposition of insulating layer 47a. Subsequent patterning and etching are conducted to produce contact openings 48a and 49a. Contact opening 49a extends downwardly through layer 47a and layer 56 to outwardly expose diffusion region 55. A subsequently deposited and patterned metal layer 58 provides desired electrical interconnection of diffusion regions 55 and 46a to $V_{cc}$. Accordingly, ohmic electrical interconnection occurs between polysilicon thin film layer 45a and conductive material within contact opening 49a through p+ diffusion region 55.

One disadvantage to this process is the large surface area, and correspondingly wafer real estate consumed, required to provide a connection to thin film layer 45a through diffusion region 55. Another disadvantage is that in the preferred split gate process, p-channel bulk devices must be formed before the thin film transistors in order to provide the p+ diffusion region 55 without additional masking steps. This undesirably subjects the p-channel devices to more thermal processing than is desired.

It would be desirable to overcome these and other problems associated with the prior art processes and constructions. While the invention was motivated by processes associated with SRAM formation, the artisan will appreciate that aspects of the invention have applicability to other methods and constructions. The invention is intended to be limited only by the accompanying claims appropriately interpreted in accordance with the Doctrine of Equivalents.

SUMMARY OF THE INVENTION

The present invention is directed to an improved method of making ohmic contact between a thin film polysilicon layer and a subsequently provided conductive layer and integrated circuitry. The improved method comprises forming a first contact opening through a first insulating layer located atop an outer region of a semiconductor substrate. The first contact opening extends to the outer region of the semiconductor substrate, with the outer region of the semiconductor substrate providing an etch stop. A conductivity enhancing dopant impurity is provided through the first contact opening and into the substrate outer region to form an electrically conductive region within the outer region of the semiconductor substrate. A thin film polysilicon layer is then provided atop the first insulating layer and into the first contact opening, the thin film polysilicon layer being in ohmic electrical contact with the electrically conductive region within the outer region of the semiconductor substrate. A second insulating layer is provided atop the thin film polysilicon layer and the first insulating layer. A second contact opening is formed through the second insulating layer and to the thin film polysilicon layer, the second contact opening being received within the first contact opening. Finally an electrically conductive layer is provided atop the second insulating layer and within the second contact opening to form a contact with the thin film polysilicon layer.

The method of the present invention may alternatively comprise forming a second contact opening through, rather than to, the second insulating layer to the thin film polysilicon layer. A third alternative method further comprises etching a third contact opening into the second insulating layer, the third contact opening extending inwardly to the electrically conductive region within the outer region of the semiconductor substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
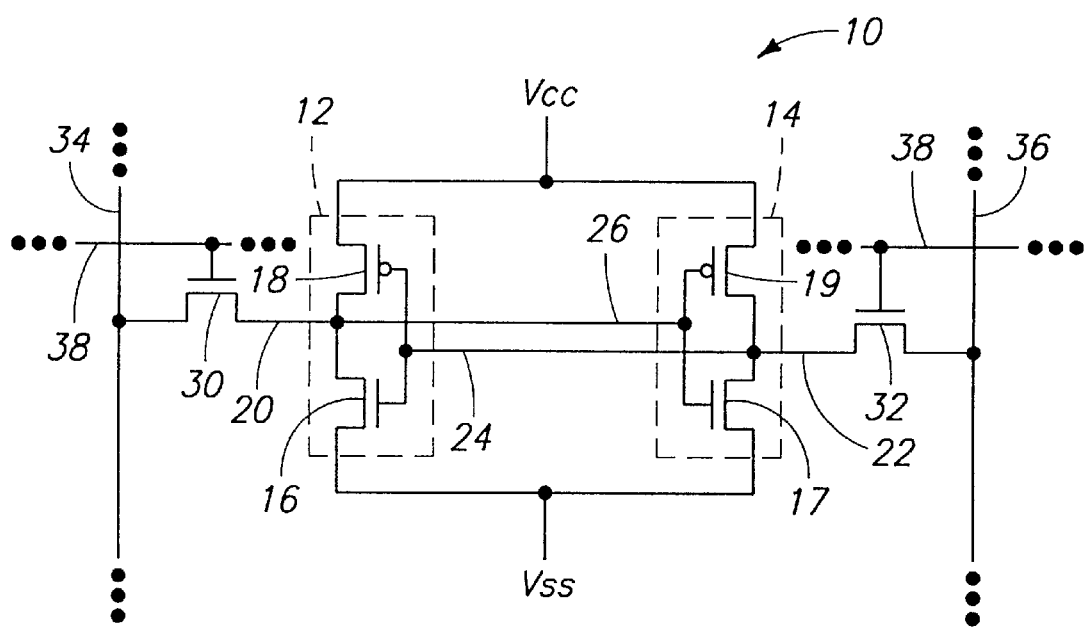
FIG. 1 is a schematic representation of a static random access memory cell in accordance with the prior art and aspects of the invention, and is referred to principally in the "Background" section above.
Figure 2:
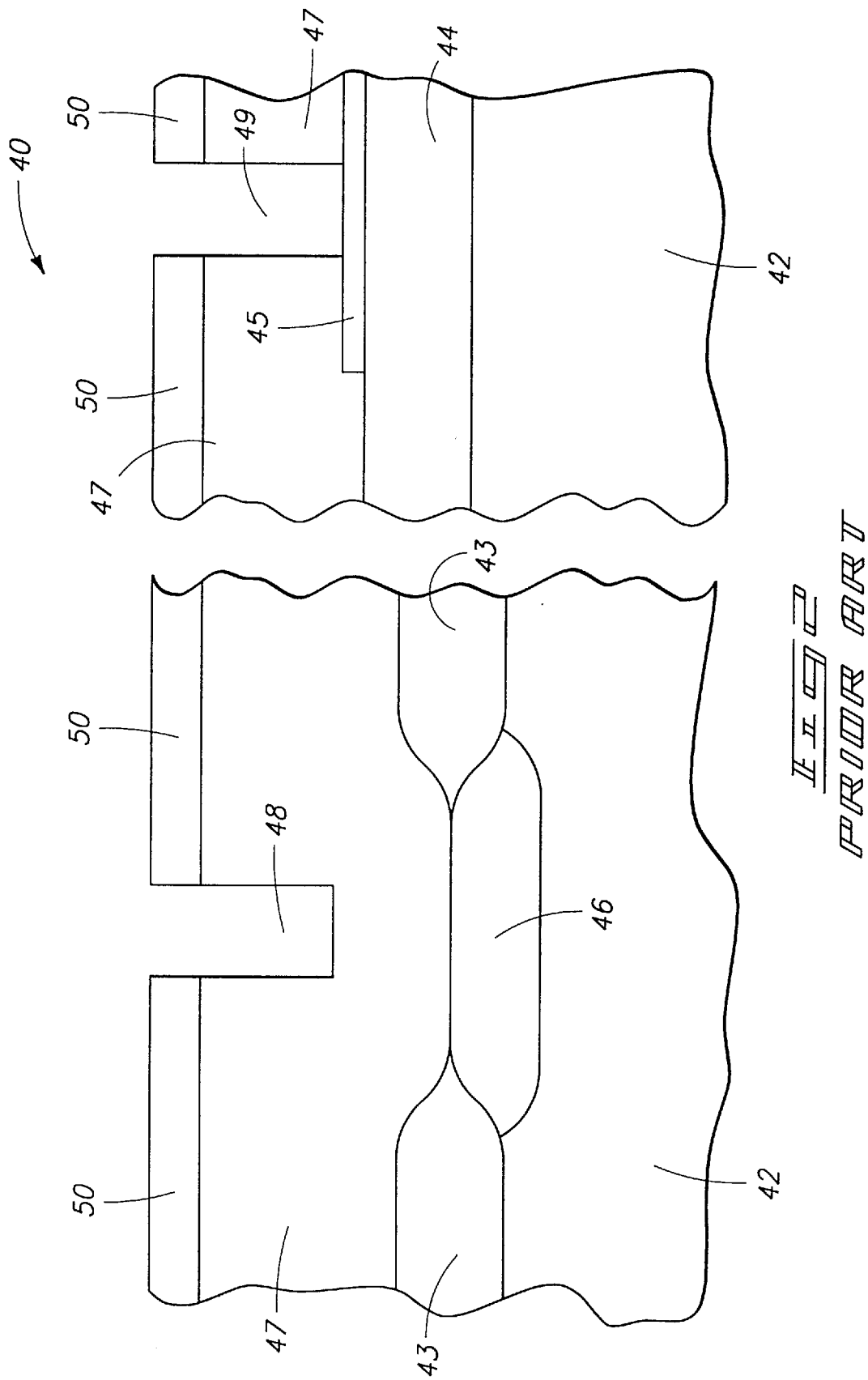
FIG. 2 is a diagrammatic sectional view of a semiconductor wafer fragment at one processing step in accordance with prior art methods, and is discussed in the "Background" section above.
Figure 3:
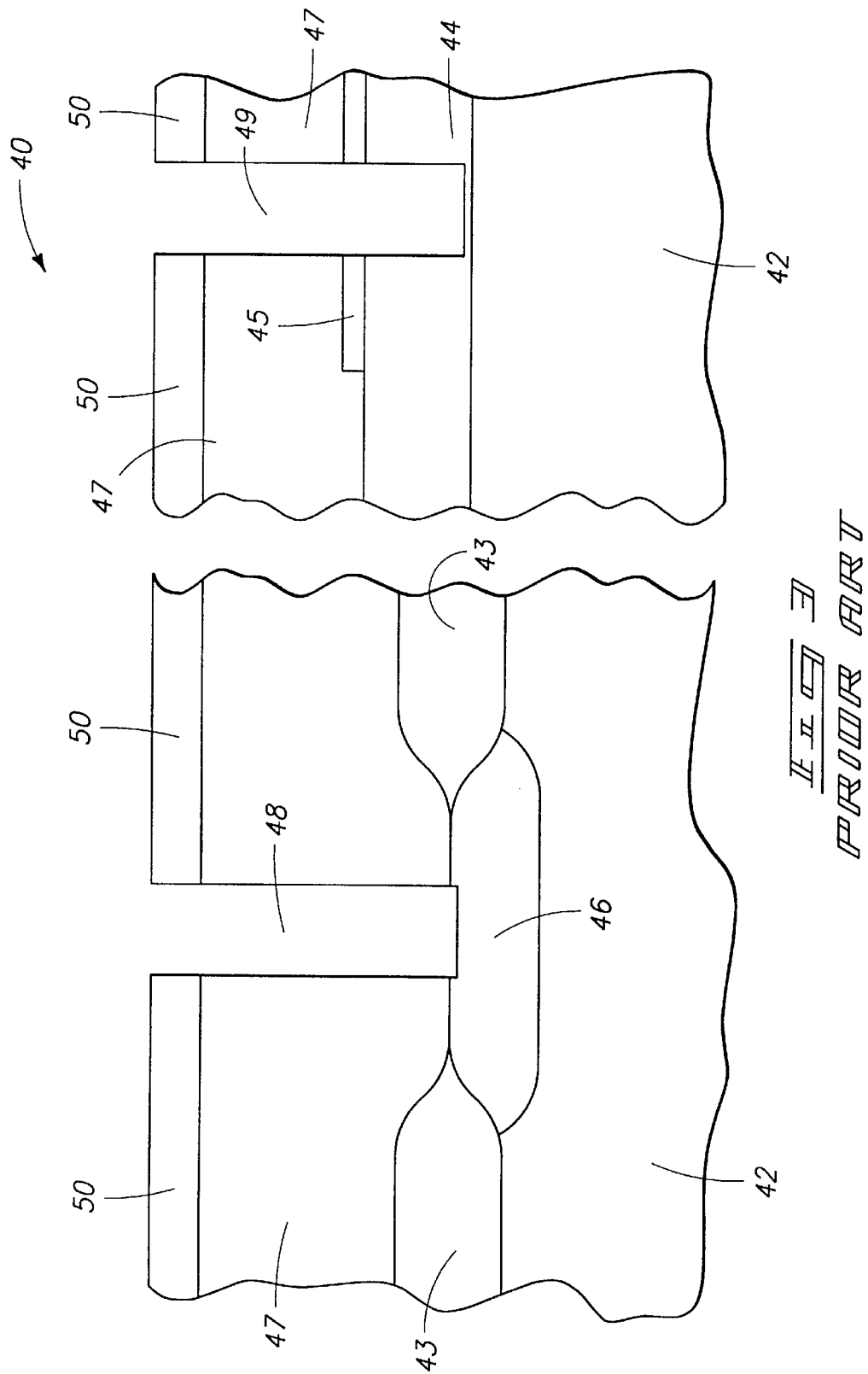
FIG. 3 is a view of the FIG. 2 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a method of making ohmic contact between a thin film transistor layer of a first conductivity type and a subsequently provided conductive layer comprises the following steps:

providing a semiconductor substrate having an outer region;

providing a first insulating layer outwardly of the outer region;

etching a first contact opening of a first diameter through the first insulating layer to the substrate outer region;

providing conductivity enhancing dopant impurity of the first conductivity type into the substrate outer region to render the outer region electrically conductive;

providing a thin film polysilicon layer of the first conductivity type into the first contact opening and in ohmic electrical connection with the substrate outer region;

providing a second insulating layer outwardly of the thin film polysilicon layer and the first insulating layer;

etching a second contact opening of a second diameter into the second insulating layer, the second contact opening overlapping with the first contact opening, the etching providing the second contact opening inwardly to the thin film polysilicon layer over the electrically conductive outer region; and providing an electrically conductive layer atop the second insulating layer and within the second contact opening to the first conductivity type doped substrate outer region.

In accordance with another aspect of the invention, an integrated circuit comprises:

a semiconductor substrate having an electrically conductive diffusion region of a first conductivity type;

a thin film polysilicon layer of the first conductivity type overlying and being in ohmic electrical connection with the substrate diffusion region; and a pillar of electrically conductive material extending outwardly from the thin film polysilicon layer over the electrically conductive diffusion region.

More particularly and initially with reference to FIGS. 5–8, a semiconductor substrate is indicated generally with reference numeral 60. Such is comprised of a lightly doped p-type silicon substrate 62 which, for purposes of the continuing discussion, has an outer region 63 comprising an n-doped well 64 ($5 \times 10^{16}$ ions/cm$^3$). Optional doped region 64 might be separately provided, or constitute dopant provided by a field implant. A first insulating layer 65, in the form of field oxide, is provided outwardly of outer region 63. A first contact opening 66 of a first diameter "A" is etched through first insulating layer 65 to substrate outer region 63.

Figure 6:
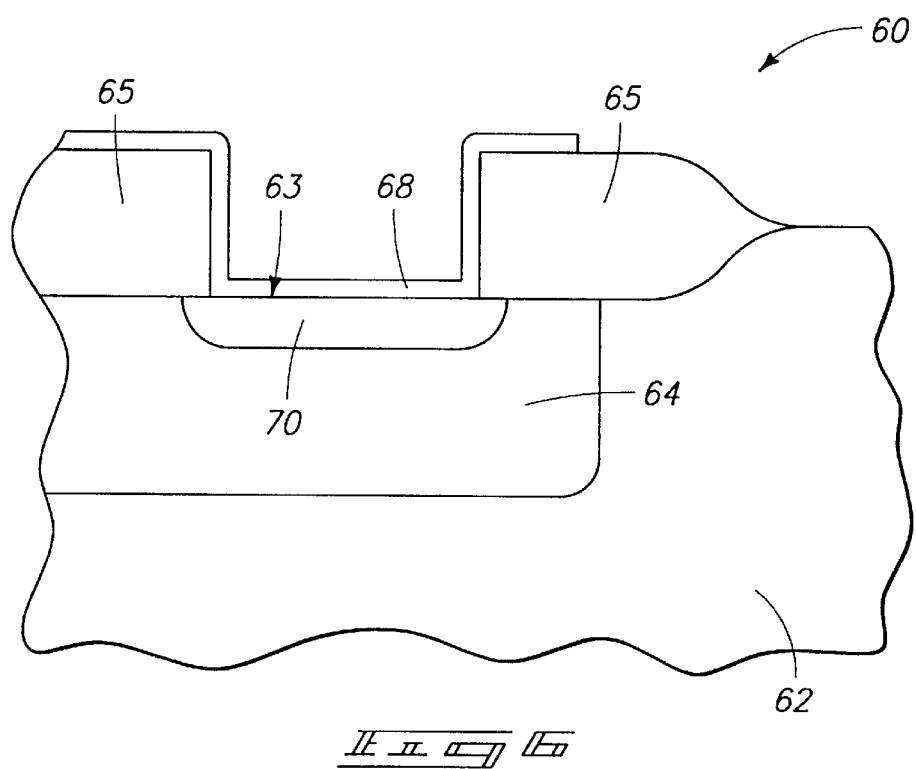
FIG. 6 is a view of the FIG. 5 wafer fragment at a processing step subsequent to that shown by FIG. 5.

Referring to FIG. 6, a thin film transistor layer 68 (e.g., 500 Angstroms) of p-type doped polysilicon is provided over the wafer into first contact opening 66 and in ohmic electrical connection with substrate outer region 63. P+ type dopant impurity is provided into substrate outer region 63 to create a p+ dopant region such as diffusion region 70. An example and preferred dopant concentration for region 70 is $2 \times 10^{19}$ ions/cm$^3$. Diffusion region 70 can be provided by p+ implant through first contact opening 66 prior to deposition of layer 68. Such region could also be created by ion implantation through layer 68 after its deposition. Further, diffusion region 70 might be substantially created coincident with deposition of p-type polysilicon of layer 68 if such p-type dopant for the polysilicon was in situ provided during deposition. Even further, dopant concentration might ultimately be provided within layer 68 to be sufficiently great such that region 70 is substantially created solely by out-diffusion of p-type dopant from layer 68 into well 64. Combinations of these techniques might also be utilized in producing a desired p+ diffusion region 70 of desired dopant concentration. Preferably, the dopant concentration of region 70 will at least be equal to that of layer 68 to provide ohmic contact and conduction therebetween.

Figure 7:
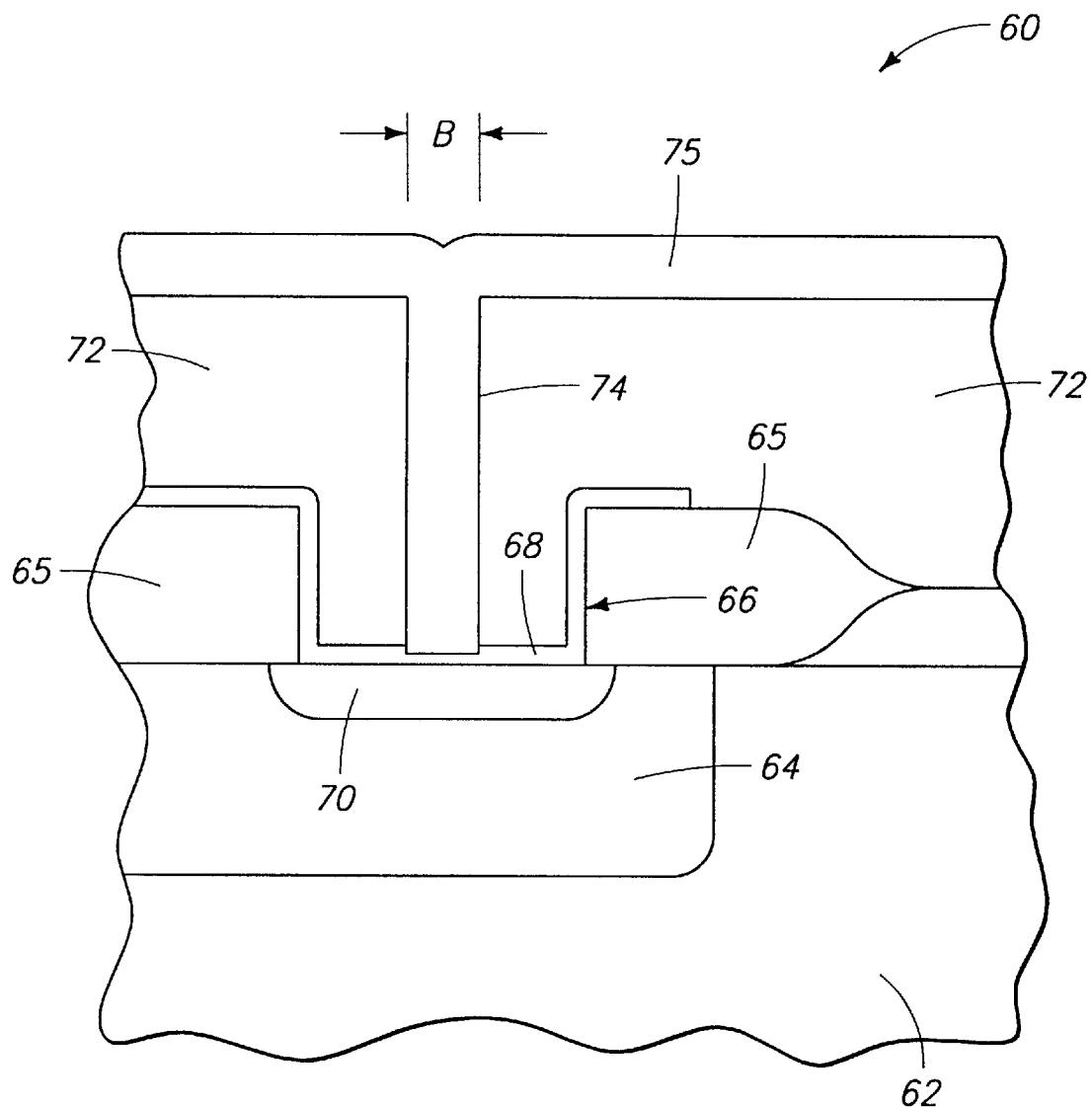
FIG. 7 is a view of the FIG. 5 wafer fragment at a processing step subsequent to that shown by FIG. 6.

Referring to FIG. 7, a second insulating layer 72 (i.e., layered TEOS oxide and borophosphosilicate glass) is provided outwardly of thin film transistor layer 68 and first insulating layer 65. A second contact opening 74 of a second diameter "B" is etched into second insulating layer 72 over the electrically conductive outer region. Second contact opening 74 overlaps with first contact opening 66, with second contact opening 74 being provided inwardly to thin film transistor layer 68. Second diameter "B" is less than or equal to first diameter "A" (preferably less than), with second contact opening 74 being received entirely within the radial confines of first contact opening 66.

Subsequently, an electrically conductive layer 75 is provided atop second insulating layer 72 and within second contact opening 74 to provide ohmic electrical connection with p+ doped diffusion region 70. Thus, ohmic contact is made between thin film transistor layer 68 and a subsequently provided conductive layer 75. Layer 75 would typically comprise a metal or metal alloy, and would be patterned as desired to form an interconnect line. Conductive layer 75 would also typically include a conventional TiSi$_x$/TiN sandwich (not shown) which results from deposition of a thin titanium layer.

Figure 8:
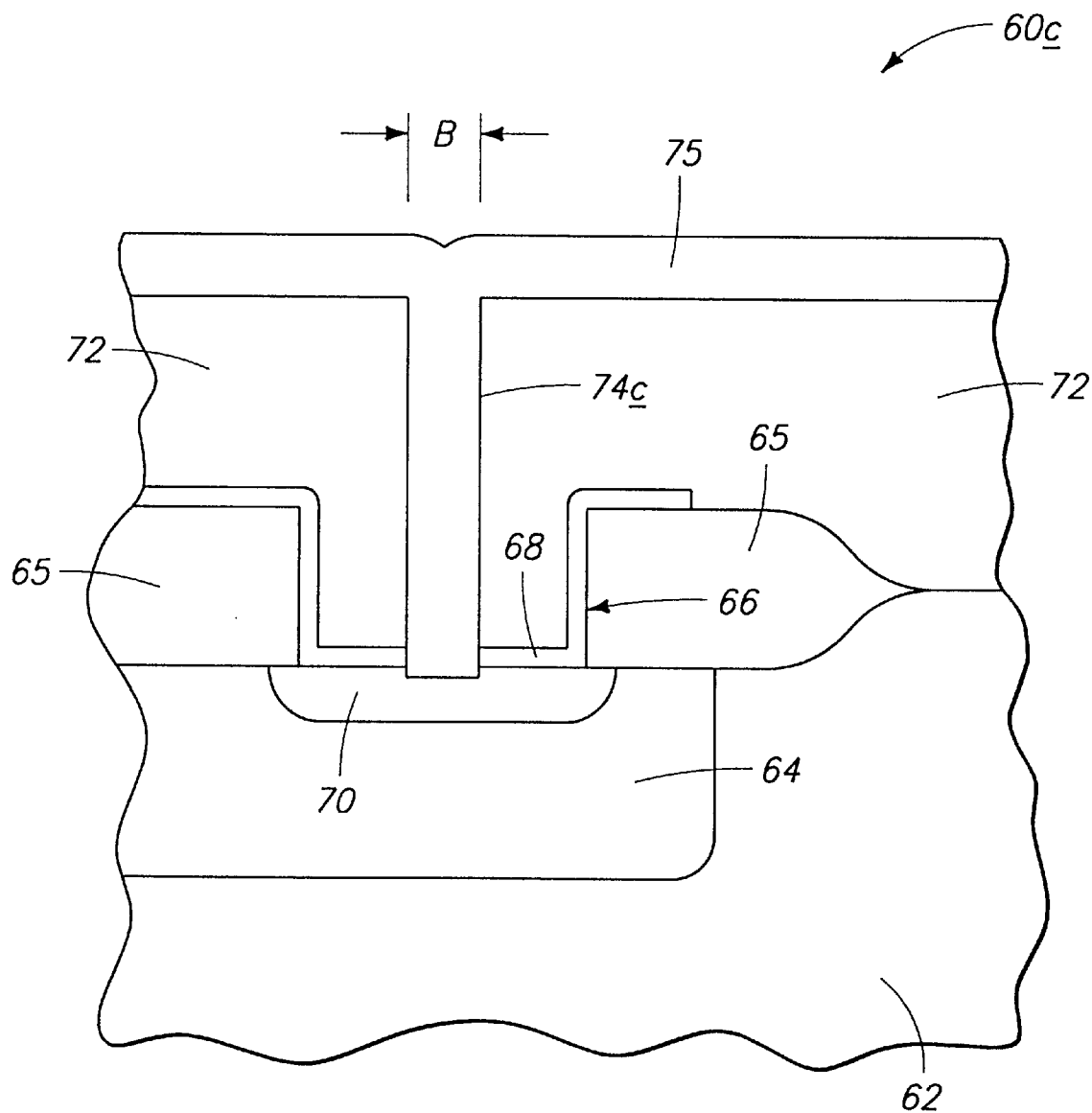
FIG. 8 is a view of the FIG. 5 wafer fragment at a processing step subsequent to that shown by FIG. 6 and corresponding to FIG. 7, but illustrating non-fatal over-etch.

FIG. 8 illustrates a significant purpose for the provision of diffusion region 70. Like numbers from the FIG. 7 construction are utilized where appropriate, with differences being indicated by the same numerals with a suffix letter "c". Illustrated is a contact opening 74c which has been over-etched entirely through layer 68 and into diffusion region 70. Region 70 is provided to accommodate such over-etching. Specifically, region 70 effectively thickens the target area to which the contact etch for contact 74/74c is being made, such that the threat of over-etch becomes insignificant as penetration of the target area is unlikely. Since this thickness is greater than that of the thin film polysilicon alone, an effectively thicker layer is provided to which contact may be formed. Accordingly, another aspect of the invention comprises:

providing a semiconductor substrate having an outer region;

providing conductivity enhancing dopant impurity of the first conductivity type into the substrate outer region to render such region electrically conductive;

providing a thin film transistor layer of the first conductivity type over the substrate outer region and in ohmic electrical connection therewith;

providing an insulating layer outwardly of the thin film transistor layer;

etching a contact opening into the insulating layer inwardly to the thin film transistor layer over the electrically conductive outer substrate region; and providing an electrically conductive layer atop the second insulating layer and within the second contact opening to the first conductivity type doped substrate outer region.

Figure 9:
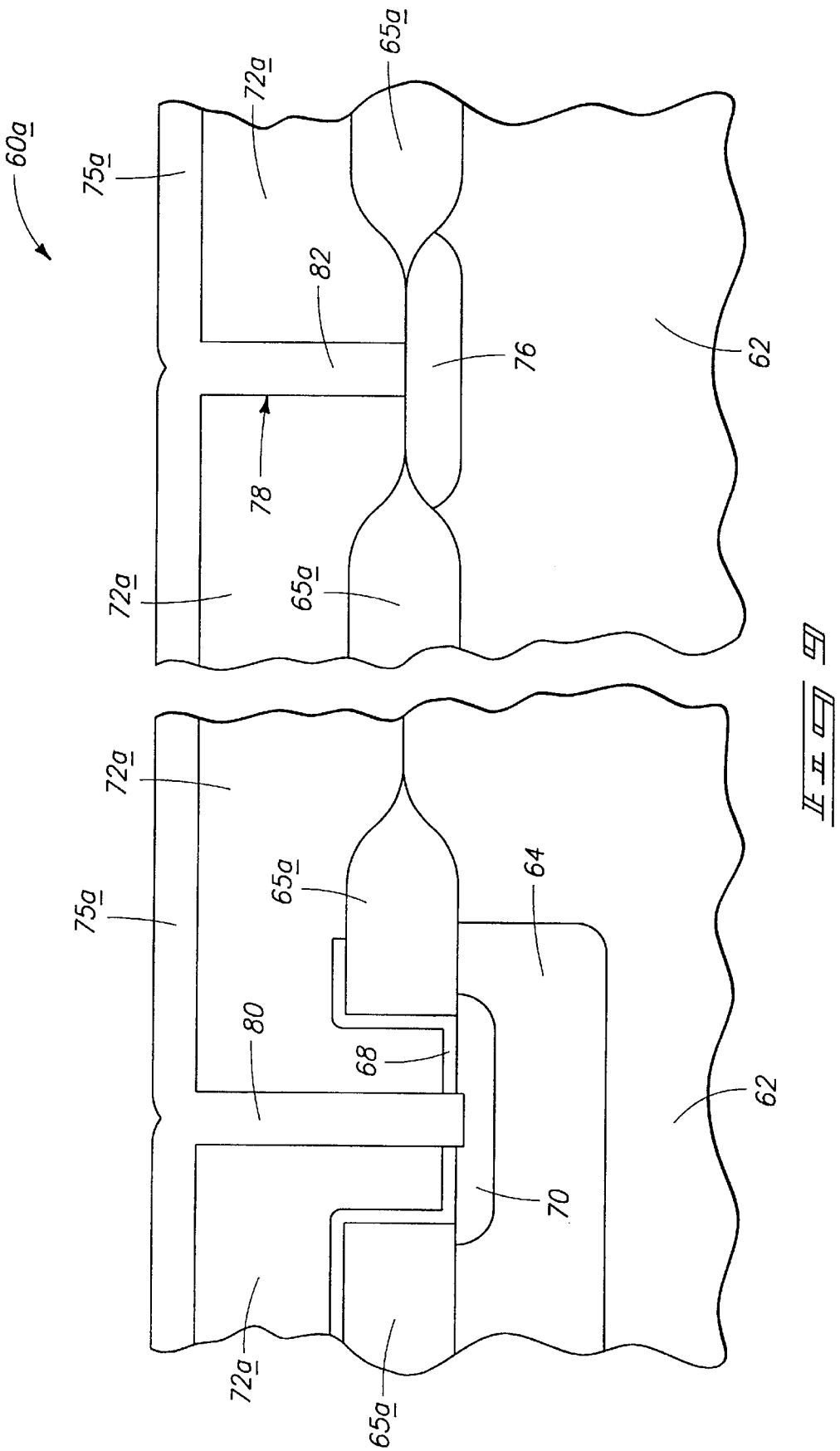
FIG. 9 is a diagrammatic section view of an alternate embodiment semiconductor wafer fragment in accordance with the invention.

FIG. 9 is a depiction of a wafer fragment 60a wherein patterning elsewhere on the wafer is simultaneously conducted to provide ohmic contact to thin film transistor layer 68 on an independent line, and to an n+ type active area diffusion region 76. Like numbers from the FIG. 8 construction are utilized where appropriate, with differences being indicated by the same numerals with a suffix letter "a". A third contact opening 78 is provided through second insulating layer 72a to extend inwardly to active area diffusion region 76. A layer 75a is deposited to fill third contact opening 78 and extend inwardly to make ohmic electrical connection with n+ diffusion region 76. Layer 75a is ultimately patterned to form interconnection line between thin film transistor layer 68 and active area diffusion region 76, or to form independent interconnection lines.

To complete the description, conductive layer 75a within second contact opening 74 constitutes a pillar 80 of electrically conductive material which extends outwardly from diffusion region 70, while the same material within third contact opening 78 constitutes a second pillar 82 of electrically conductive material extending outwardly from n+ type diffusion region 76. First pillar 80 has a total cross-sectional area where it passes through thin film transistor layer 68 which is less than the total outer area of diffusion region 70.

Such comprises an example portion of an integrated circuit in accordance with the invention. Such can be utilized to produce a static random access memory cell of the FIG. 1 schematic. The illustrated thin film transistor layer 68 would constitute a common source region of a pair of load transistors associated with a pair of inverters. N+ diffusion region 76 would constitute a circuit node formed elsewhere on the substrate, with layer 75a being ultimately patterned to connect the first and second pillars 80, 82 to respective conductive lines as required by the circuit design.

The above-described example relationships with respect to p-type and n-type dopant regions could, of course, be reversed. One of n-type or p-type dopant material would constitute a first conductivity type, while the other of the p-type or n-type material would constitute a second conductivity type.

Usually, the contact which is formed immediately prior to thin film transistor poly deposition does not require a long etch, since it must only remove the thin film transistor gate oxide from the underlying interconnects. This is not sufficient in itself to remove all of the field oxide from over the illustrated n-well regions for $V_{cc}$ to thin film poly connection. However as an alternate example of producing an effective first contact opening in an SRAM chip, such may be produced using a series of typical or other process steps utilized in formation of an SRAM cell.

For example, in most SRAM cells, buried contacts are used to connect bulk MOS gate poly to active area diffusion regions. This process removes approximately 500 Angstroms of oxide if conducted over field oxide. Additionally, special implants are often conducted through a sacrificial oxide layer prior to removal of this oxide and conducting gate oxide growth. If this implant is conducted over field oxide, the wet etch rate of the oxide is enhanced, causing approximately 500 Angstroms more oxide to be removed during the sacrificial oxide strip. Additionally, the contact that is formed to connect a second polysilicon layer to either a poly 1 layer or active area (e.g., "BC2 or Second Buried Contact") typically can be used to remove an additional 500 Angstroms of field oxide. Spacer etches will further thin the field oxide. Finally as an example, the contact that is used to connect the TFT load to underlying conductors (eg: "exhumed contact") can be used to complete the first contact opening through the field oxide.

Specifically, consider an SRAM circuit that uses a 4000 Angstrom field oxide for isolation between active areas. After formation of the field oxide, the oxidation masking nitride and pad oxide is removed. This sequence thins the field oxide to approximately 3300 Angstroms. A sacrificial oxide is then grown (300 Angstroms) which thickens the field oxide to approximately 3500 Angstroms. Special implants can be conducted through this layer, such as a buried contact implant which would improve the continuity of the buried contact. The buried contact implant is masked to only allow the implant into the active areas immediately adjacent to the buried contact.

However, the buried contact mask can also be opened over the field oxide where the ultimate first contact opening is to be formed. The buried contact implant damages the surface of the field oxide so that when the sacrificial oxide is stripped (typically using a buffered HF etch), the oxide etch rate is enhanced over the field oxide in which the buried contact implant was allowed to occur. The sacrificial oxide strip usually removes approximately 500 Angstroms of unimplanted oxide, and 1000 Angstroms of implanted oxide leaving 2500 Angstroms of field oxide over the first contact opening area.

After a sacrificial oxide strip, a gate oxide is formed (100 Angstroms) and a thin polysilicon layer is deposited (500 Angstroms). A buried contact is etched through the thin poly and the gate oxide over the active areas where connection is desired from the poly 1 layer and the active area. This buried pattern can also be formed over the first contact opening area. The buried contact etch removes about 500 Angstroms of field oxide, leaving 2000 Angstroms over the first contact opening. A thicker poly layer is then deposited and patterned. The first poly is removed from over the first contact opening area to allow further oxide removal during subsequent steps.

During the following steps, formation of the n-channel devices proceeds, which includes spacer formation. The spacer process removes an additional 400 Angstroms of field oxide and thins the first contact opening oxide to 1600 Angstroms. An oxide layer is then deposited to isolate a second poly layer from the first poly layer and the active areas. To allow connection of the second poly layer to underlying conductive layers, a second buried contact (BC2) is formed. The isolating oxide may be 1500 Angstroms thick and the etch used to form the BC2 (including overetch margin) may be designed to remove 2500 Angstroms of oxide. This BC2 etch also is used to thin the oxide over the first contact opening area, bringing the remaining oxide to 500 Angstroms.

Finally, a TFT Gate Oxide is deposited (200 Angstroms) and an exhumed contact is etched through this oxide to allow connection of the TFT poly to underlying conductive layers. The exhumed contact pattern is also opened over the first contact opening, and the etch is allowed to proceed such that all of the remaining oxide over the first contact opening is removed. The first contact opening through the field oxide is then completed without there having been an added, specifically dedicated separate masking.

Figure 10:
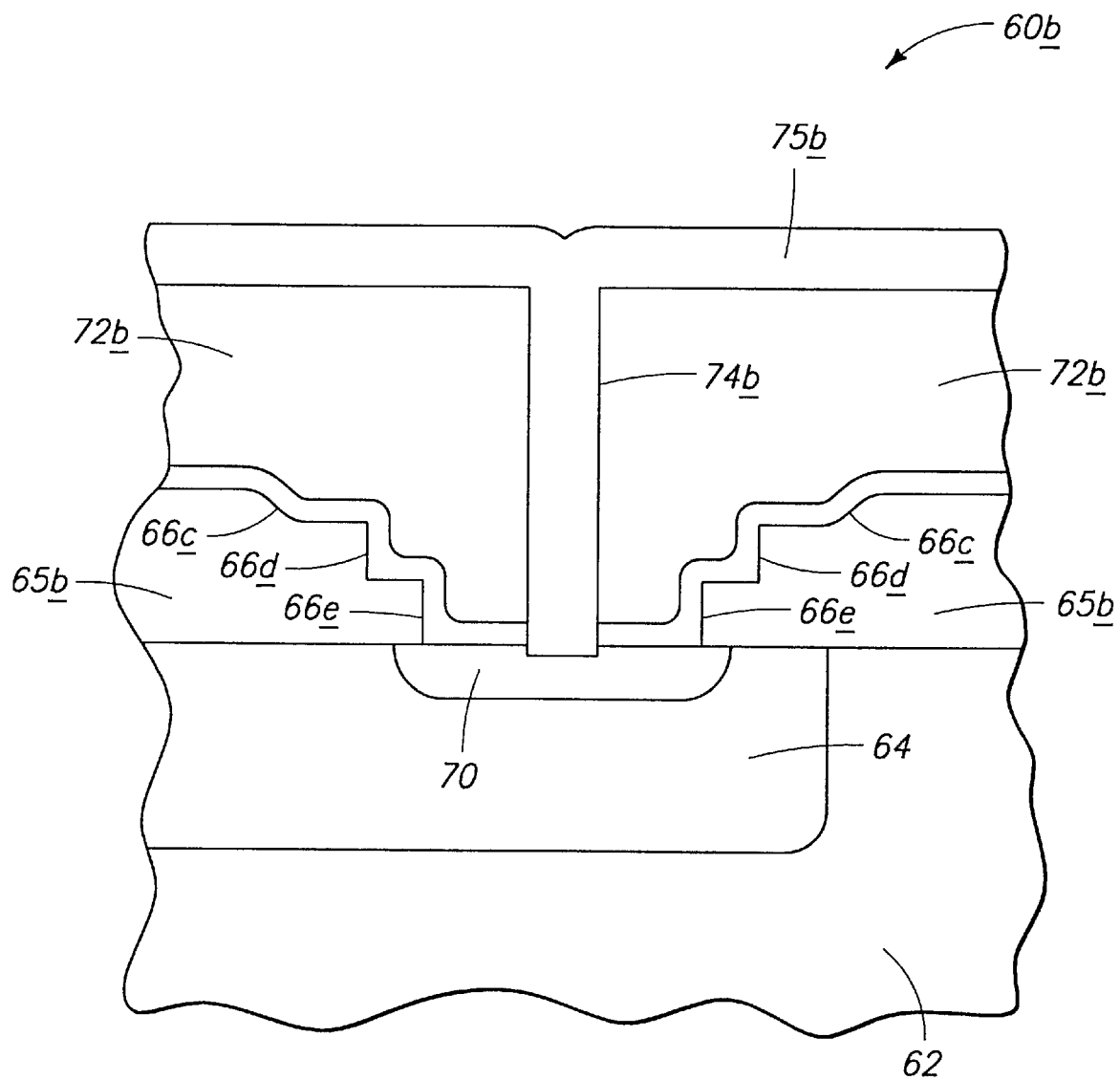
FIG. 10 is a diagrammatic section view of still another alternate embodiment wafer fragment in accordance with the invention.

A simplified finished construction intended to be exemplary of the above described process is shown in FIG. 10. A substrate 60b is shown wherein an ultimate contact opening 66e which outwardly exposes diffusion region 70 starts by preceding formation of wider, inwardly stepped contact openings 66c and 66d.

Figure 4:
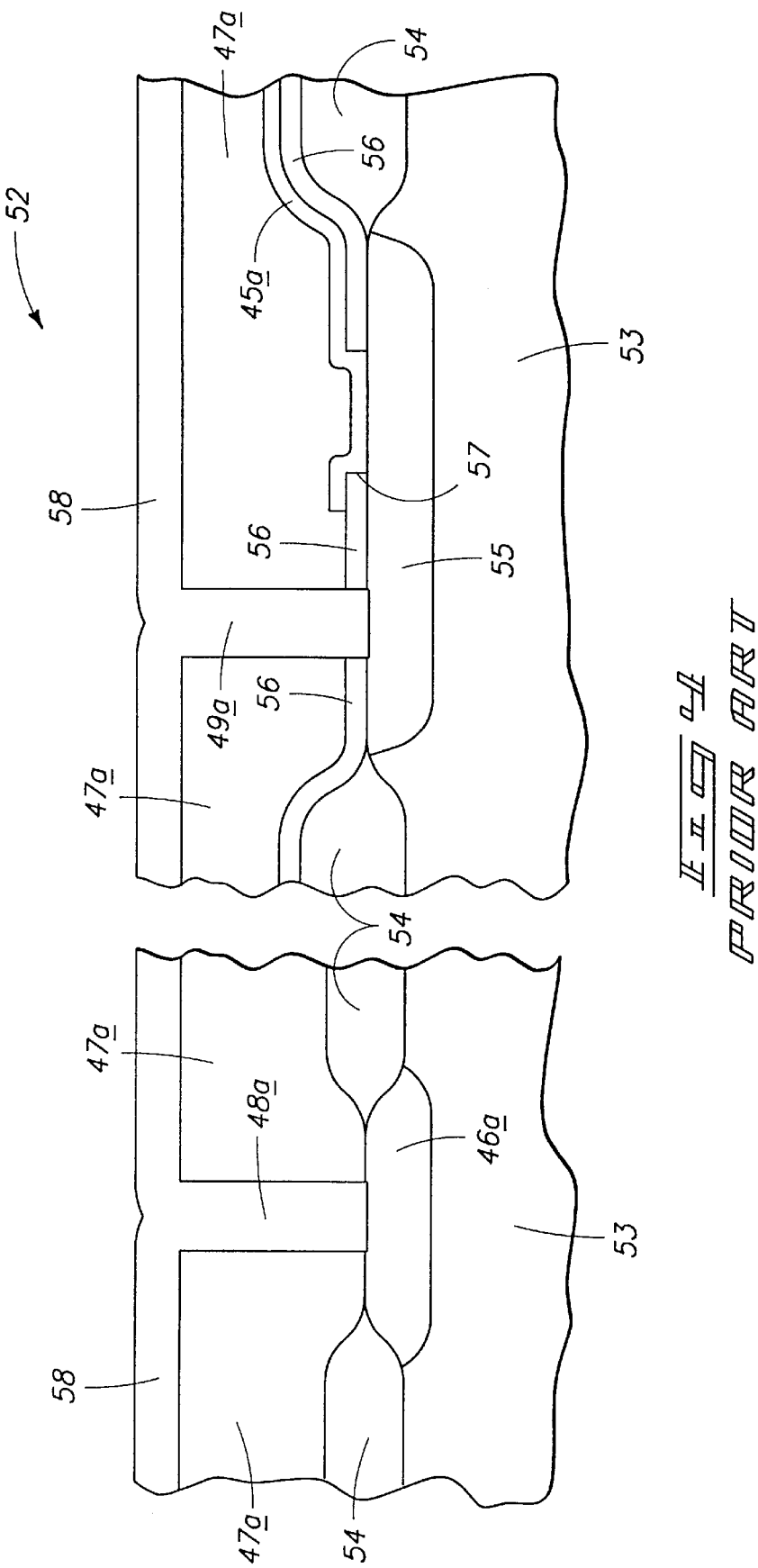
FIG. 4 is a diagrammatic fragmentary view of another semiconductor wafer fragment at a prior art processing step, and is discussed in the "Background" section above.
Figure 5:
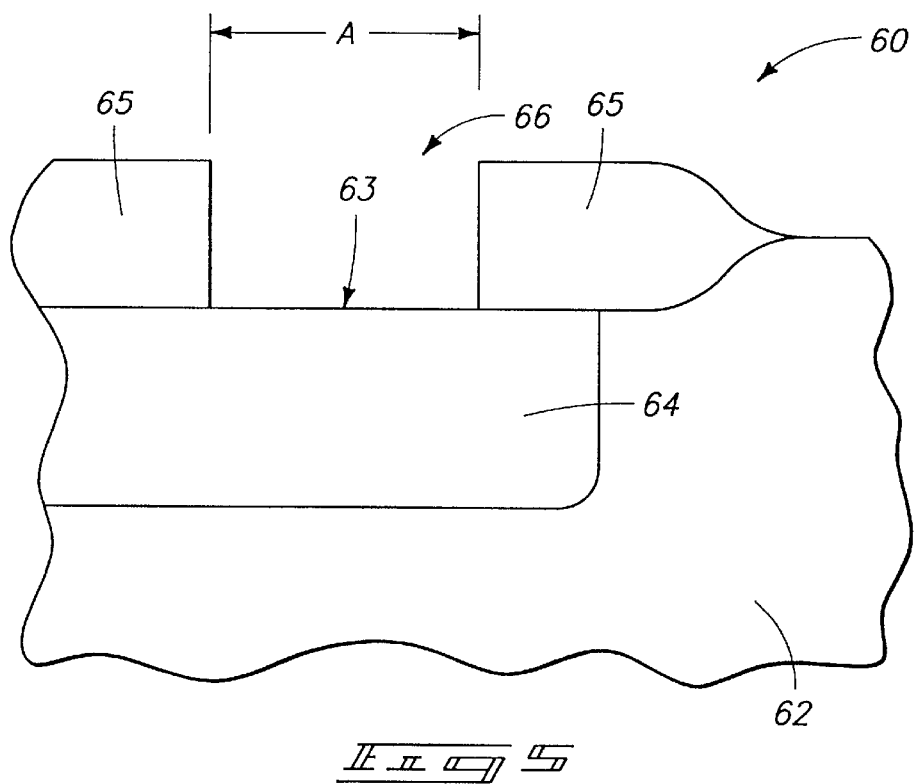
FIG. 5 is a diagrammatic sectional view of a semiconductor wafer at one processing step in accordance with the invention.

Though shown and described principally in the context of a split gate poly SRAM process, the invention's advantages make it useful to other processes as well. Silicon real estate consumption over that shown by prior art FIG. 4 is significantly reduced.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of making ohmic contact between a thin film polysilicon layer of a first conductivity type and a subsequently provided conductive layer comprising the following steps:

providing a semiconductor substrate having an outer region;

forming a first insulating layer outwardly of the outer region;

etching a first contact opening of a first cross-sectional area through the first insulating layer to the substrate outer region, the first contact opening having an outer perimeter;

providing conductivity enhancing dopant impurity of the first conductivity type into the substrate outer region to render the outer region electrically conductive;

forming a thin film polysilicon layer of the first conductivity type within the first contact opening and in ohmic electrical connection with the electrically conductive substrate outer region;

forming a second insulating layer outwardly of the thin film thin film polysilicon layer and the first insulating layer;

etching a second contact opening into the second insulating layer, the second contact opening contacting the thin film polysilicon layer, the second contact opening having a second cross-sectional area where it contacts the polysilicon layer, the second cross-sectional area being less than the first cross-sectional area, the second contact opening overlapping the first contact opening and being received entirely inwardly of the outer perimeter of the first contact opening; and forming an electrically conductive layer atop the second insulating layer and within the second contact opening to ohmically contact the thin film polysilicon layer.

2. The method of making ohmic contact of claim 1 wherein the second contact opening etch provides the second contact opening through the thin film polysilicon layer inwardly to the first conductivity type doped outer substrate region.

3. The method of making ohmic contact of claim 1 wherein the substrate outer region is of the second conductivity type prior to the step of providing first conductivity type dopant into the substrate outer region.

4. The method of making ohmic contact of claim 1 wherein the step of providing first conductivity type dopant into the substrate outer region occurs prior to the step of forming the thin film polysilicon layer.

5. The method of making ohmic contact of claim 1 wherein the step of providing first conductivity type dopant into the substrate outer region occurs coincident with the step of forming the thin film polysilicon layer.

6. The method of making ohmic contact of claim 1 wherein the step of providing first conductivity type dopant into the substrate outer region solely comprises out diffusion of first conductivity type dopant from the thin film polysilicon layer into the substrate outer region.

7. A method of making ohmic contact between a thin film polysilicon layer of a first conductivity type and a second conductivity type active area diffusion region in a semiconductor substrate comprising the following steps:

providing a semiconductor substrate having an outer region of the second conductivity type and having a second conductivity type active area diffusion region;

forming a first insulating layer outwardly of the outer region;

etching a first contact opening of a first cross-sectional area through the first insulating layer to the substrate outer region, the first contact opening having an outer perimeter;

providing conductivity enhancing dopant impurity of the first conductivity type into the substrate outer region to render the outer region electrically conductive;

forming a thin film polysilicon layer of the first conductivity type within the first contact opening and in ohmic electrical connection with the substrate outer region;

forming a second insulating layer outwardly of the thin film polysilicon layer and the first insulating layer;

etching second and third contact openings into the second insulating layer, the second contact opening contacting the thin film polysilicon layer, and overlapping with the first contact opening, the second contact opening having a second cross-sectional area where it contacts the thin film polysilicon layer, the second cross-sectional area being less than the first cross-sectional area, and the second contact opening being received entirely inwardly of the outer perimeter of the first contact opening, the third contact opening extending inwardly to the active area diffusion region;

forming an electrically conductive layer atop the second insulating layer and within the second contact and third contact openings; and patterning the electrically conductive layer to form an interconnection line between the thin film polysilicon layer and the active area diffusion region.

8. The method of making ohmic contact of claim 7 wherein the second contact opening etch provides the second contact opening through the thin film polysilicon layer inwardly to the first conductivity type doped outer substrate region.

9. The method of making ohmic contact of claim 7 wherein the step of providing first conductivity type dopant into the substrate outer region occurs prior to the step of forming the thin film polysilicon layer.

10. The method of making ohmic contact of claim 7 wherein the step of providing first conductivity type dopant into the substrate outer region occurs coincident with the step of forming the thin film polysilicon layer.

11. The method of making ohmic contact of claim 7 wherein the step of providing first conductivity type dopant into the substrate outer region solely comprises out diffusion of first conductivity type dopant from the thin film polysilicon layer into the substrate outer region.

12. A method of making ohmic contact between a thin film polysilicon layer and a conductive layer, comprising the following steps:

forming a first contact opening of a first cross-sectional area through a first insulating layer to a substrate outer region, the first contact opening having an outer perimeter;

providing conductivity enhancing dopant impurity into the substrate outer region to render the outer region electrically conductive;

forming a thin film polysilicon layer within the first contact opening and in ohmic electrical connection with the substrate outer region;

forming a second insulating layer within the first contact opening and outwardly of the thin film polysilicon layer;

forming a second contact opening through the second insulating layer and in contact with the polysilicon layer, the second contact opening having a second cross-sectional area where it contacts the polysilicon layer, the second cross-sectional area being less than the first cross-sectional area, the second contact opening being received entirely inwardly of the outer perimeter of the first contact opening and overlapping the first contact opening; and forming an electrically conductive layer atop the second insulating layer and within the second contact opening to ohmically contact the thin film polysilicon layer.

13. A method of making ohmic contact between a thin film polysilicon layer and a conductive layer, comprising the following steps:

forming a first contact opening of a first cross-sectional area through a first insulating layer to a substrate region, the first contact opening having an outer perimeter;

providing a conductivity enhancing dopant impurity within the substrate region;

forming a thin film polysilicon layer within the first contact opening and in ohmic electrical connection with the substrate region;

forming a second insulating layer within the first contact opening and outwardly of the thin film polysilicon layer and forming a second contact opening of a second cross-sectional area through the second insulating layer, the second cross-sectional area being less than the first cross-sectional area, the second contact opening overlapping the first contact opening and being received entirely inwardly of the outer perimeter of the first contact opening, the second contact opening opening inwardly through the thin film polysilicon layer and into the substrate region; and forming an electrically conductive layer atop the second insulating layer and within the second contact opening to ohmically contact the thin film polysilicon layer.

14. A method of forming a contact to a thin film polysilicon layer comprising the following steps:

forming the thin film polysilicon layer over and electrically coupled with a diffusion region, the diffusion region having an outer first total area; and forming a conductive material pillar in contact with the thin film polysilicon layer and over the diffusion region, the pillar having a total cross sectional second area where the pillar joins the thin film polysilicon layer, the total cross sectional second area being less than the outer first total area.

15. A method of forming a contact to a thin film polysilicon layer comprising the following steps:

forming a field oxide region over a semiconductor substrate;

forming an opening in the field oxide region to the semiconductor substrate;

forming a diffusion region beneath the opening and within the semiconductor substrate;

forming the thin film polysilicon layer within the opening and electrically coupled with the diffusion region, the diffusion region having an outer first total area; and forming a conductive material pillar in electrical contact with the thin film polysilicon layer and over the diffusion region, the pillar having a total cross sectional second area where the pillar joins the thin film polysilicon layer, the total cross sectional second area being less than the outer first total area.

16. The method of claim 15 wherein the diffusion region is formed by ion-implantation before forming the thin film polysilicon layer.

17. The method of claim 15 wherein the diffusion region is formed by ion-implantation after forming the thin film polysilicon layer.

18. The method of claim 15 wherein the thin film polysilicon layer comprises a dopant and wherein the diffusion region is formed by out-diffusion of a dopant from the thin film polysilicon layer.

19. The method of claim 15 wherein the thin film polysilicon layer extends over the field oxide region.

20. A method of forming a contact to a thin film polysilicon layer comprising the following steps:

forming a field oxide region over a semiconductor substrate;

forming an opening in the field oxide region to the semiconductor substrate;

forming a diffusion region beneath the opening and within the semiconductor substrate;

forming the thin film polysilicon layer within the opening and electrically coupled with the diffusion region; and forming a conductive material pillar in electrical contact with the thin film polysilicon layer and over the diffusion region.

21. The method of claim 20 wherein the pillar is in direct physical contact with the diffusion region.

* * * * *

UNITED STATES PATENT AND TRADEMARK OFFICE
CERTIFICATE OF CORRECTION

PATENT NO.   : 5,930,662
DATED        : July 27, 1999
INVENTOR(S)  : Monte Manning It is certified that error appears in the above-identified patent and that said Letters Patent is hereby corrected as shown below:

Specification:
Column 2,
Line 29, change "polysilicon gate" to -- gate polysilicon --;
Line 30, change "poly" (first occurrence) to -- (poly) -- and change "gate (poly)" to -- gate poly --;

Column 6,
Line 17, after "region" insert -- , --; and
Line 25, change "in situ" to -- *in situ* --.

Claims:
Claim 1, column 9,
Line 65, after "the" (first occurrence) insert -- thin film --.

Signed and Sealed this

Twenty-eighth Day of August, 2001

*Attest:*

NICHOLAS P. GODICI
*Attesting Officer*   *Acting Director of the United States Patent and Trademark Office*

UNITED STATES PATENT AND TRADEMARK OFFICE
CERTIFICATE OF CORRECTION

PATENT NO. : 5,930,662  
DATED : July 27, 1999  
INVENTOR(S) : Manning

Page 1 of 1

It is certified that error appears in the above-identified patent and that said Letters Patent is hereby corrected as shown below:

<u>Column 1,</u>  
Line 15, before "Technical Field", please insert the following paragraph heading and paragraph:

GOVERNMENT RIGHTS

This invention was made with the United States Government support under contract No. MDA972-92-C-0054 awarded by the Advanced Research Projects Agency (ARPA). The United States Government has certain rights in this invention.

Signed and Sealed this

First Day of January, 2002

*Attest:*

JAMES E. ROGAN  
*Director of the United States Patent and Trademark Office*

*Attesting Officer*